United States Patent
Park et al.

(10) Patent No.: US 11,624,110 B2
(45) Date of Patent: Apr. 11, 2023

(54) METHOD OF COATING A SUBSTRATE AND COATING APPARATUS FOR COATING A SUBSTRATE

(71) Applicant: Applied Materials, Inc., Santa Clara, CA (US)

(72) Inventors: Hyun Chan Park, Alzenau (DE); Thomas Gebele, Freigericht (DE); Ajay Sampath Bhoolokam, Frankfurt (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/391,145

(22) Filed: Aug. 2, 2021

(65) Prior Publication Data

US 2021/0355578 A1 Nov. 18, 2021

Related U.S. Application Data

(62) Division of application No. 16/092,797, filed as application No. PCT/EP2016/059776 on May 2, 2016, now Pat. No. 11,118,261.

(51) Int. Cl.
*H01J 37/34* (2006.01)
*C23C 14/35* (2006.01)

(52) U.S. Cl.
CPC .......... *C23C 14/35* (2013.01); *H01J 37/3405* (2013.01); *H01J 37/3455* (2013.01); *H01J 37/3464* (2013.01); *H01J 2237/332* (2013.01)

(58) Field of Classification Search
CPC ... C23C 14/35; H01J 37/3405; H01J 37/3455; H01J 37/3464
(Continued)

(56) References Cited

U.S. PATENT DOCUMENTS

| | | | |
|---|---|---|---|
| 6,402,904 B1 * | 6/2002 | Baldwin | H01J 37/3233 204/298.03 |
| 2007/0089983 A1 * | 4/2007 | Plaisted | H01J 37/3405 204/192.1 |

(Continued)

FOREIGN PATENT DOCUMENTS

| | | |
|---|---|---|
| CN | 101297059 A | 10/2008 |
| CN | 102549706 A | 7/2012 |

(Continued)

OTHER PUBLICATIONS

International Search Report and Written Opinion dated Dec. 22, 2017 for Application No. PCT/EP2017/074657.

(Continued)

*Primary Examiner* — Rodney G McDonald
(74) *Attorney, Agent, or Firm* — Patterson + Sheridan, LLP (57) ABSTRACT

According to one aspect of the present disclosure, a method of coating a substrate (100) with at least one cathode assembly (10) having a sputter target (20) and a magnet assembly (25) that is rotatable around a rotation axis (A) is provided. The method comprises: Coating of the substrate (100) while moving the magnet assembly in a reciprocating manner in a first angular sector (12); and subsequent coating of the substrate (100) while moving the magnet assembly (25) in a reciprocating manner in a second angular sector (14) different from the first angular sector (12). According to a second aspect, a coating apparatus for performing said method is provided.

14 Claims, 6 Drawing Sheets

(58) Field of Classification Search
USPC .................................. 204/298.21, 298.22
See application file for complete search history.

(56) References Cited

U.S. PATENT DOCUMENTS

| | | | | |
|---|---|---|---|---|
| 2012/0273343 | A1* | 11/2012 | Bender | H01J 37/3455 204/192.12 |
| 2016/0163914 | A1 | 6/2016 | Gonzalez et al. | |
| 2017/0077343 | A1 | 3/2017 | Morad et al. | |
| 2017/0213929 | A1 | 7/2017 | Lance et al. | |
| 2017/0243986 | A1 | 8/2017 | Lin et al. | |

FOREIGN PATENT DOCUMENTS

| | | |
|---|---|---|
| CN | 104919597 A | 9/2015 |
| CN | 106449883 A | 2/2017 |
| CN | 206293457 U | 6/2017 |
| CN | 107195719 A | 9/2017 |
| CN | 206524340 U | 9/2017 |
| JP | H11-29866 A | 2/1999 |
| JP | 2003293130 A | 10/2003 |
| JP | 2004140022 A | 5/2004 |
| JP | 2009-512788 A | 3/2009 |
| JP | 201177148 A | 4/2011 |
| JP | 2013-506756 A | 2/2013 |
| JP | 2013206904 A | 10/2013 |
| JP | 2015-524022 A | 8/2015 |
| JP | 201763199 A | 3/2017 |
| KR | 20120092619 A | 8/2012 |
| TW | 201013940 A | 4/2010 |
| WO | 2017/190800 A1 | 11/2017 |
| WO | 2017/190801 A1 | 11/2017 |

OTHER PUBLICATIONS

Taiwan Office Action dated Aug. 28, 2019 for Application No. 107134348.
Japanese Office Action dated Nov. 19, 2019 for Application No. 2018-553216.
Chinese Office Action dated Jan. 6, 2020 for Application No. 201780032894.4.
Korean Office Action dated Apr. 22, 2020 for Application No. 10-2018-7031344.
Chinese Office Action dated Jun. 23, 2020 for Application No. 201780032894.4.
Japanese Office Action dated Mar. 10, 2020 for Application No. 2018-553216.
Korean Office Action dated Nov. 23, 2020 for Application No. 10-2018-7031344.
Restriction Requirement for U.S. Appl. No. 16/092,797 dated Aug. 10, 2020.
Office Action for U.S. Appl. No. 16/092,797 dated Nov. 16, 2020.
Office Action for Chinese Application No. 201680084064.1 dated Mar. 1, 2021.
Search Report for Chinese Application No. 201680084064.1 dated Feb. 22, 2021.
Korean Office Action dated May 6, 2020 for Application No. 10-2018-7031964.
Japan Office Action dated Jan. 14, 2020 for Application No. 2018-556960.

* cited by examiner

METHOD OF COATING A SUBSTRATE AND COATING APPARATUS FOR COATING A SUBSTRATE

CROSS-REFERENCE TO RELATED APPLICATIONS

This application is a divisional of U.S. patent application Ser. No. 16/092,797, filed Oct. 11, 2018, which is a National Phase Application of International Application No. PCT/EP2016/059776, filed May 2, 2016, both of which are herein incorporated by reference in their entirety.

TECHNICAL FIELD

The present disclosure relates to a method of coating a substrate and to a coating apparatus for coating a substrate. More specifically, the present disclosure relates to a method of coating a substrate with a thin layer by sputtering and to a sputter apparatus for coating substrates. More specifically, the present disclosure is directed at magnetron sputtering wherein the sputter target can be a rotatable target.

BACKGROUND

Forming a layer on a substrate with a high uniformity (i.e., uniform thickness and uniform electric properties over an extended surface) is a relevant issue in many technological fields. For example, in the field of thin film transistors (TFTs) thickness uniformity and uniformity of electrical properties may be an issue for reliably manufacturing display channel areas. Furthermore, a uniform layer typically facilitates manufacturing reproducibility.

One method for forming a layer on a substrate is sputtering, which has developed as a valuable method in diverse manufacturing fields, for example in the fabrication of TFTs. During sputtering, atoms are ejected from the material of a sputter target by bombardment thereof with energetic particles (e.g., energized ions of an inert or reactive gas). The ejected atoms may deposit on the substrate, so that a layer of sputtered material can be formed on the substrate.

Uniform layers of sputtered material over an extensive substrate surface may be difficult to achieve, e.g. due to an irregular spatial distribution of sputtered material. The provision of multiple sputter targets over the substrate may improve layer uniformity. It may further be beneficial to have a high degree of homogeneity in terms of characteristics such as the grown crystal structure, the specific resistance or other electric properties of the deposited layer, and the stress of the layer. For instance, in the production of metalized layers, the signal delay is dependent on the thickness of the layer so that, e.g., in the production of displays, a varying thickness might result in pixels that are energized at slightly different times. It is further beneficial to achieve a uniform layer thickness when etching a layer in order to achieve the same etching results at different positions.

Accordingly, further methods and/or sputter apparatuses for facilitating a highly uniform layer of sputtered material are beneficial.

SUMMARY

In light of the above, methods of coating a substrate as well as coating apparatuses for coating a substrate are provided.

According to one aspect of the present disclosure, a method of coating a substrate with at least one cathode assembly having a sputter target and a magnet assembly that is rotatable around a rotation axis is provided. The method includes: coating of the substrate while moving the magnet assembly in a reciprocating manner in a first angular sector; and subsequent coating of the substrate while moving the magnet assembly in a reciprocating manner in a second angular sector different from the first angular sector.

According to a further aspect, a method of coating a substrate with at least one cathode assembly having a rotatable sputter target and a magnet assembly positioned inside the rotatable sputter target is provided, the magnet assembly being rotatable around a rotation axis. The method includes: coating of the substrate while moving the magnet assembly in a reciprocating manner in a first angular sector, wherein a first center angular position of the first angular sector is located on a first side of a plane perpendicularly extending from the substrate to the rotation axis; positioning the magnet assembly in a second angular sector different from the first angular sector, while keeping the target at essentially zero voltage; and subsequent coating of the substrate while moving the magnet assembly in a reciprocating manner in the second angular sector wherein a second center angular position of the second angular sector is located on a second side of said plane.

According to yet another aspect, a coating apparatus for coating a substrate is provided. The coating apparatus includes: at least one cathode assembly having a sputter target; a magnet assembly positioned inside the sputter target and rotatable around a rotation axis; and an actuator configured for moving the magnet assembly during coating in a reciprocating manner in two or more different angular sectors in succession, wherein center angular positions and extension angles of the angular sectors can be adjusted, respectively.

Further aspects, advantages, and features of the present disclosure are apparent from the dependent claims, the description, and the accompanying drawings.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following. Some embodiments are depicted in the drawings and are detailed in the description which follows.

DETAILED DESCRIPTION

Reference will now be made in detail to the various embodiments of the disclosure, one or more examples of which are illustrated in the figures. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

The process of coating a substrate with a material as described herein refers typically to thin-film applications. The term "coating" and the term "depositing" are used synonymously herein. The coating process used in embodiments described herein is sputtering.

Sputtering can be undertaken as diode sputtering or as magnetron sputtering. Magnetron sputtering is particularly advantageous in that the deposition rates are rather high. By arranging the magnet assembly or magnetron behind the sputter material of the sputter target, in order to trap the free electrons within the magnetic field, which is generated in direct vicinity of the target surface, these electrons are forced to move within the magnetic field and cannot escape. This enhances the probability of ionizing the gas molecules typically by several orders of magnitude. This, in turn, increases the deposition rate substantially. For example, in the event of a rotatable sputter target, which may have an essentially cylindrical form, the magnet assembly can be positioned inside of the rotatable sputter target.

The term "magnet assembly" as used herein may refer to a unit capable of generating a magnetic field. Typically, the magnet assembly may consist of a permanent magnet. This permanent magnet may be arranged within the sputter target such that charged particles can be trapped within the generated magnetic field, e.g. in an area above the sputter target. In some embodiments, the magnet assembly includes a magnet yoke.

The substrate can be continuously moved during coating past the cathode assembly ("dynamic coating"), or the substrate may rest essentially at a constant position during coating ("static coating"). The methods described in the present disclosure particularly relate to static coating processes.

In a static deposition process, the substrate may remain stationary during coating. It is to be noted that the term "static" deposition process, which is different as compared to "dynamic" deposition processes, does not exclude any movement of the substrate as would be appreciated by a skilled person. For example, according to embodiments described herein, static sputtering can include, for example, a stationary substrate position during deposition (without any substrate movement), an oscillating substrate position during deposition, an average substrate position that is substantially constant during deposition, a dithering substrate position during deposition and/or a wobbling substrate position during deposition. Accordingly, a static deposition process can be understood as a deposition process with a stationary position, a deposition process with a substantially static position, or a deposition process with a partially static position of the substrate.

Static coating can be advantageous in that the amount of target material used up for the coating is smaller in comparison to dynamic coating since in the latter case the substrate holders are often coated as well. Static coating particularly allows for the coating of large-area substrates. The substrates are entered into a coating area in front of one or more sputter targets, the coating is performed, and the substrates are taken out of the coating area after coating.

The examples described herein can be utilized for deposition on large area substrates, e.g. for lithium battery manufacturing or electrochromic windows. As an example, a plurality of thin film batteries can be formed on a large area substrate using the cooling device for processing a layer including a material having a low melting temperature. According to some examples, a large area substrate can be GEN 4.5, which corresponds to about 0.67 $m^2$ substrates (0.73×0.92 m), GEN 5, which corresponds to about 1.4 $m^2$ substrates (1.1 m×1.3 m), GEN 7.5, which corresponds to about 4.29 $m^2$ substrates (1.95 m×2.2 m), GEN 8, which corresponds to about 5.3 $m^2$ substrates (2.16 m×2.46 m), or even GEN 10, which corresponds to about 9.0 $m^2$ substrates (2.88 m×3.13 m). Even larger generations such as GEN 11, GEN 12 and/or corresponding substrate areas can similarly be implemented.

The term "substrate" as used herein shall particularly embrace inflexible substrates, e.g., glass plates. The present disclosure is not limited thereto and the term "substrate" may also embrace flexible substrates such as a web or a foil.

Sputtering can be used in the production of displays. In more detail, sputtering may be used for the metallization such as the generation of electrodes or buses. Sputtering is also used for the generation of thin film transistors (TFTs). Sputtering may also be used for the generation of the ITO (indium tin oxide) layer. Sputtering can also be used in the production of thin-film solar cells. A thin-film solar cell includes a back contact, an absorbing layer, and a transparent and conductive oxide layer (TCO). The back contact and the TCO layer can be produced by sputtering whereas the absorbing Layer may be made in a chemical vapour deposition process.

Figure 1A:
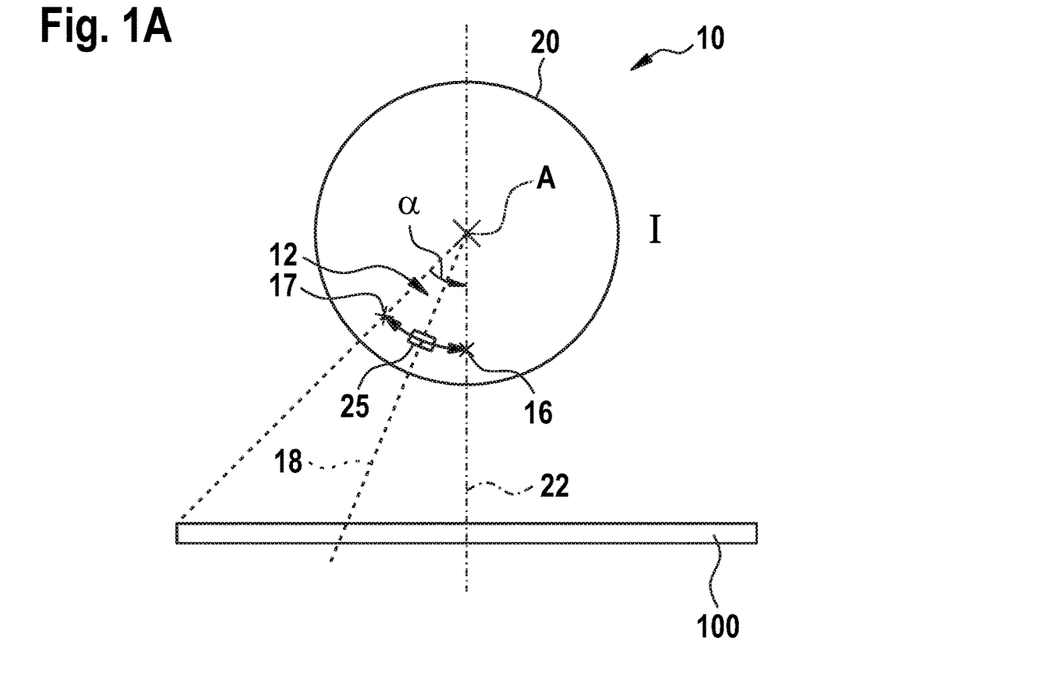
FIG. 1A and FIG. 1B show schematic sectional views of a coating apparatus for illustrating methods of coating a substrate in accordance with embodiments described herein.
Figure 1B:
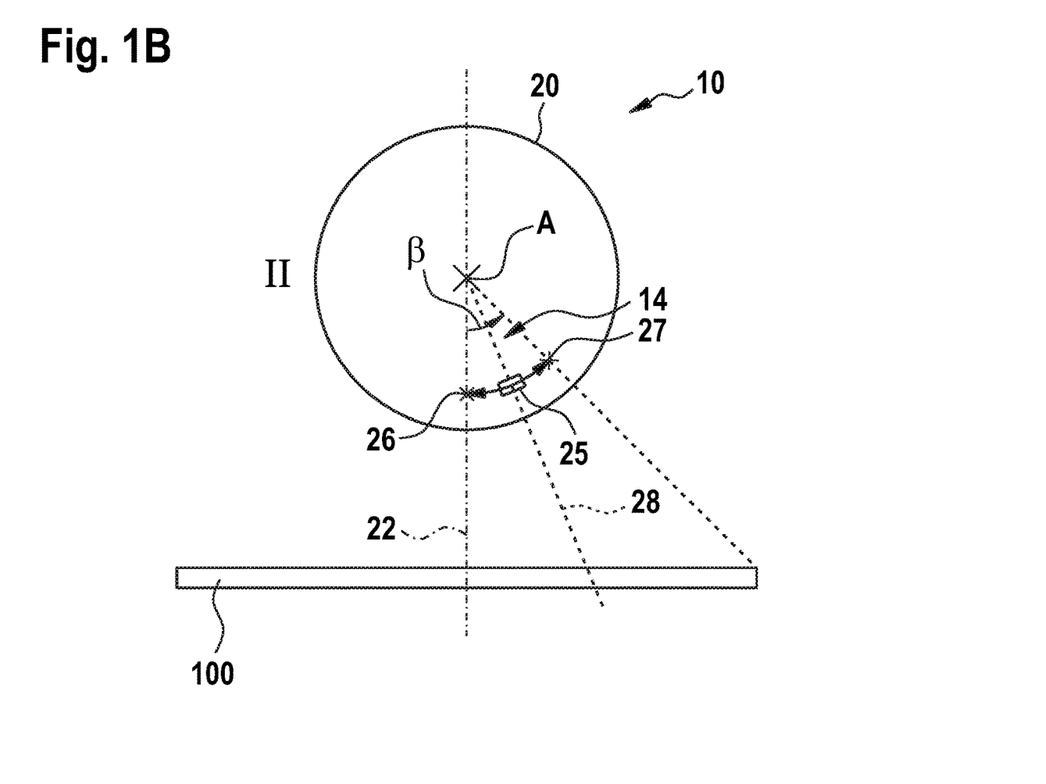

According to an aspect of the present disclosure, a method of coating a substrate with a coating apparatus is described. FIG. 1A and FIG. 1B show an apparatus configured for performing the methods described herein in a schematic sectional view.

The coating apparatus shown in FIG. 1A and FIG. 1B includes a cathode assembly 10, which includes a sputter target 20 for providing a material to be deposited and a magnet assembly 25 which is movable around a rotation axis A.

The sputter target 20 may be made of or include at least one material selected from the group including: aluminum, silicon, tantalum, molybdenum, niobium, titanium, indium, gallium, zinc, tin, silver and copper. Particularly, the target material can be selected from the group including indium, gallium and zinc.

In some embodiments, the sputter target 20 may be a rotatable sputter target. For example, the sputter target 20 can be an essentially cylindrical target and/or may be rotatable around an axis which may correspond to the rotation axis A of the magnet assembly. In some embodiments, the magnet assembly 25 is arranged inside the sputter target 20 and can be pivoted around the axis of rotation of the sputter target 20 along a magnet assembly movement path.

A substrate 100 to be coated can be arranged such that the substrate faces the sputter target 20 of the cathode assembly 10. Therein, the substrate 100 can be held on a substrate holder which can be transported into the coating apparatus and out of the coating apparatus. For coating the substrate 100, an electric potential such as a negative potential can be applied to the sputter target 20.

A first coating phase I of the sputter method described herein is shown in FIG. 1A, and a subsequent coating phase II of the sputter method to be conducted after the first coating phase I is shown in FIG. 1B. The first coating phase I includes coating of the substrate 100 while the magnet assembly 25 is moved in a reciprocating manner in a first angular sector 12, as is shown in FIG. 1A, and the subsequent coating phase II includes coating of the substrate 100 while the magnet assembly 25 is moved in a reciprocating manner in a second angular sector 14, as is shown in FIG. 1B.

Movement in a reciprocating manner as used herein may be understood as a repeated back-and-forth movement, and particularly as a repeated clockwise and counterclockwise rotation of the magnet assembly 25 around the rotation axis A in an angular sector, particularly between two angular positions, respectively. For example, during the first coating phase I (shown in FIG. 1A), the magnet assembly 25 may be repeatedly moved to-and-fro between a first turnaround angular position 16 and a second turnaround angular position 17 of the first angular sector 12, and during the subsequent coating phase II (shown in FIG. 1B) the magnet assembly 25 may be repeatedly moved to-and-fro between a first turnaround angular position 26 and a second turnaround angular position 27 of the second angular sector 14. In some embodiments, the first turnaround angular position 16 and the second turnaround angular position 17 of the first angular sector 12 and the first turnaround angular position 26 and the second turnaround angular position 27 of the second angular sector 14 are different angular positions, respectively.

For example, in some embodiments, the first angular sector 12 and the second angular sector 14 do partially, but not entirely, overlap, e.g. by an overlap angle of 30° or less, particularly 15° or less. In other embodiments, the first angular sector 12 and the second angular sector 14 do not overlap. For example, the second angular sector 14 starts at an angular position at which the first angular sector 12 ends. In other words, the first turnaround angular position 16 of the first angular sector 12 may correspond to the first turnaround angular position 26 of the second angular sector 14, as is indicated in FIGS. 1A and 1B. In yet further embodiments, the first angular sector 12 may be distant from the second angular sector 14 so that the first angular sector 12 and the second angular sector 14 do not share a common angular position.

A movement in a reciprocating manner may also be referred to herein as a wobble movement of the magnet assembly. During a wobble movement, the magnet assembly 25 first moves to a first side of a center angular position, then turns around at a first turnaround position and moves to a second side of the center angular position, then again turns around at a second turnaround position and moves back to the first side of the center angular position, whereupon the wobble movement may stop or may continue accordingly. Sputter deposition may take place during the wobble movement of the magnet assembly. In other words, the substrate is coated with a thin material layer during the wobble movement of the magnet assembly. Thickness uniformity of the layer deposited on the substrate can be improved, as a single sputter target can be used for coating a larger area of the substrate due to the wobble movement of the magnet assembly. In particular, wobbling of the magnet assembly may lead to a charged particle cloud which spatially shifts clockwise and counterclockwise in a reciprocating manner between a first radial direction and a second radial direction.

In some embodiments, the wobble movement may be an essentially continuous movement. Therein, the magnet assembly may move clockwise and counterclockwise in an angular sector essentially without stopping at the turnaround angular positions. For example, the stopping time of the magnet assembly at the turnaround positions may be a short period of 0.1 seconds or less, or 0.05 seconds or less.

According to methods disclosed herein, wobbling of the magnet assembly 25 takes place in two or more different angular sectors of a magnet assembly movement path in succession. First, as shown in FIG. 1A, during the first wobble phase, a first section of the substrate may be predominantly coated, and then, as is shown in FIG. 1B, during the second wobble phase, a second section of substrate may subsequently be predominantly coated. During the first wobble phase, a first part of a layer or a first layer may be deposited on the substrate, and during the second wobble phase a second part of the layer or a second layer may be deposited on the substrate. Consecutive wobbling of the magnet assembly in different angular sections may further improve the homogeneity of the deposited layer. In particular, uniformity variations of layer properties such as electric properties, e.g. the uniformity variation of the conductivity of the deposited layer, may be reduced by subsequent wobbling around different center angular positions. In particular, by dividing a large wobble sector in two or more smaller angular sectors, in which wobbling takes places successively, overall layer uniformity can be improved.

In some embodiments, during the first coating phase I, the magnet assembly is moved back and forth two or more times, particularly three or more times, more particularly four or more times, or even five or more times between the first turnaround angular position 16 and the second turnaround angular position 17 of the first angular sector 12. Alternatively or additionally, in some embodiments, during the subsequent coating phase II, the magnet assembly is moved back and forth two or more times, particularly three or more times, more particularly four or more times, or even five or more times between a first turnaround angular position 26 and a second turnaround angular position 27 of the second angular sector 14. The turnaround positions may define the two outer angular positions of the respective angular sector.

During movement of the magnet assembly 25 around the rotation axis A, the orientation of the magnet assembly may change in correspondence with the angular position of the magnet assembly. For example, when the magnet assembly 25 is arranged at a first angular position, the magnetic field generated by the magnet assembly may be oriented such that charged particles can be confined around a first radial direction extending from the rotation axis through the first angular position. Accordingly, when the magnet assembly 25 is moved to a second angular position, the magnetic field generated by the magnet assembly may move such as to confine free charged particles around a second radial direction extending from the rotation axis through the second angular position.

The first angular sector 12 and the second angular sector 14 are different angular sectors. In some embodiments, the angular extension α of the first angular sector 12 may be different from the second angular extension β of the second angular sector 14. In some embodiments, which may be combined with other embodiments disclosed herein, a first center angular position 18 of the first angular sector 12 may be different from a second center angular position 28 of the second angular sector 14.

A center angular position of an angular sector as used herein can be understood as an angular position between the two outer angular positions (turnaround angular positions) of the angular sector, and particularly as the angular position in the middle between the two outer angular positions. For example, if the angular sector extends over an angular extension of 30°, the center angular position may be located between the two outer angular positions of the angular sector at 15° from both outer angular positions.

In some embodiments, the first angular sector 12 and the second angular sector 14 have essentially the same angular extensions α, β. Accordingly, the angle α between the first turnaround angular position 16 and the second turnaround angular position 17 of the first angular sector 12 may essentially correspond to the angle β between the first turnaround angular position 26 and the second turnaround angular position 27 of the second angular sector 14. However, the first center angular position 18 of the first angular sector 12 may be different from the second center angular position 28 of the second angular sector 14. In this case, during coating, the magnetic field that is generated by the magnet assembly 25 may wobble by essentially the same amount around two different center angle positions.

In some embodiments, which may be combined with other embodiments described herein, the first center angular position 18 of the first angular sector 12 is different from the second center angular position 28 of the second angular sector 14. More particularly, in some embodiments, the first center angular position 18 and the second center angular position 28 may enclose an angle of 30° or more, particularly 45° or more, more particularly 60 or even up to 90°. Accordingly, during the first coating phase I, a first section of the substrate may be predominantly coated, and, during the subsequent coating phase II, a second section of the substrate may be predominantly coated.

In some embodiments, which may be combined with other embodiments disclosed herein, the first angular sector 12 may extend over a first angular extension α of 15° or more and 60° or less, and/or the second angular sector 14 may extend over an angular extension β of 15° or more and 60° or less. Uniformity of the deposited layers can be improved.

In some embodiments, the cathode assembly may only include a single magnet assembly. For example, a single magnet assembly which is movable around the rotation axis may be arranged inside a rotatable target and may be configured such that subsequent wobbling in different angular sectors is possible with the single magnet assembly. Interactions and interference between two or more magnet assemblies can be avoided, when the sputter targets include only a single magnet assembly, respectively.

In some embodiments, which may be combined with other embodiments disclosed herein, a plane 22 perpendicularly extending from the substrate 100 to the rotation axis A defines a zero angular position of the magnet assembly 25 with respect to the rotation axis A. The zero angular position of the magnet assembly 25 may be the point of intersection of the essentially circular magnet assembly movement path and said plane 22. For example, the zero angular position of the magnet assembly may be the angular position of the magnet assembly with a minimum distance between the magnet assembly and the substrate. At an angle of 180°, the distance between the magnet assembly and the substrate may be maximal. The magnet assembly 25 can be rotated clockwise around the rotation axis A from the zero angular position (positive angular range), and the magnet assembly may be rotated counterclockwise around the rotation axis A from the zero angular position (negative angular range), or vice versa.

The first center angular position 18 of the first angular sector 12 may be offset from the zero angular position, and the second center angular position 28 of the second angular sector 14 may be offset from the zero angular position. In some embodiments, the first center angular position 18 may be located on a first side of the plane 22, and the second center angular position 28 may be located on a second side of the plane 22. For example, the first center angular position 18 may be located between 15° and 45° from the zero angular position on the first side of said plane 22, and the second center angular position 28 may be located between −15° and −45° from the zero angular position on the second side of said plane 22. In particular, the second center angular position 28 may be a mirror position of the first center angular position 18 with respect to said plane 22. Accordingly, a first part of a deposited layer which is deposited during the first coating phase I may be a mirror part with respect to said plane 22 of a second part of the deposited layer which is deposited during the subsequent coating phase II. Overall layer uniformity can be improved.

As is shown in FIG. 1A, in some embodiments, the first center angular position 18 may be located at an angle between 15° and 25° with respect to the zero angular position, and, as can be seen in FIG. 1B, the second center angular position 28 may be located at an angle between −15° and −25° with respect to the zero angular position defined by plane 22. Further, the angular extensions α, β of the first angular sector 12 and of the second angular sector 14 may both be between 30° and 60°, but on opposite sides of said plane 22, i.e. located clockwise and counterclockwise from the zero angular position.

In some embodiments, the first turnaround angular position 16, i.e. the inner turnaround position, of the first angular sector 12 may correspond to the first turnaround angular position 26, i.e. the inner turnaround position, of the second angular sector 14, wherein both inner turnaround angular positions may essentially be located in said plane 22. This may lead to a constant thickness of a coating layer from a substrate area close to the sputter target to a substrate area distant from the sputter target, e.g. in the middle between two adjacent sputter targets.

Ion bombardment of the sputter target can be kept more constant, when the first angular sector 12 is partially or entirely located on the first side of said plane 22, and the second angular sector 14 is partially or entirely located on the other side of said plane 22. For example, more than 80% or more than 95% of the first angular sector 12 may be located on the first side of said plane 22, and more than 80% or more than 95% of the second angular sector 14 may be located on the second side of said plane 22. In some embodiments, which may be combined with other embodiments disclosed herein, the first angular sector 12 may correspond to the second angular sector 14 mirrored at said plane 22.

Sputter modes like wobbling a magnet assembly in a single angular sector during coating or sputter modes like coating while maintaining constant positions of the magnet assembly may be improvable with regard to layer uniformity, as the ion bombardment may depend on the target to substrate distance and on the incident angle of the ions at different magnetron positions. In order to control the ion bombardment in a more uniform way, the method disclosed herein includes moving the magnet assembly subsequently in a reciprocating manner in different angular sectors. Such a "split wobble deposition mode" in accordance with embodiments described herein provides for a wider ion bombardment control as compared to the previously mentioned sputter modes and may enhance the layer uniformity with respect to layer thickness and with respect to electrical properties of the deposited layer.

Figure 2A:
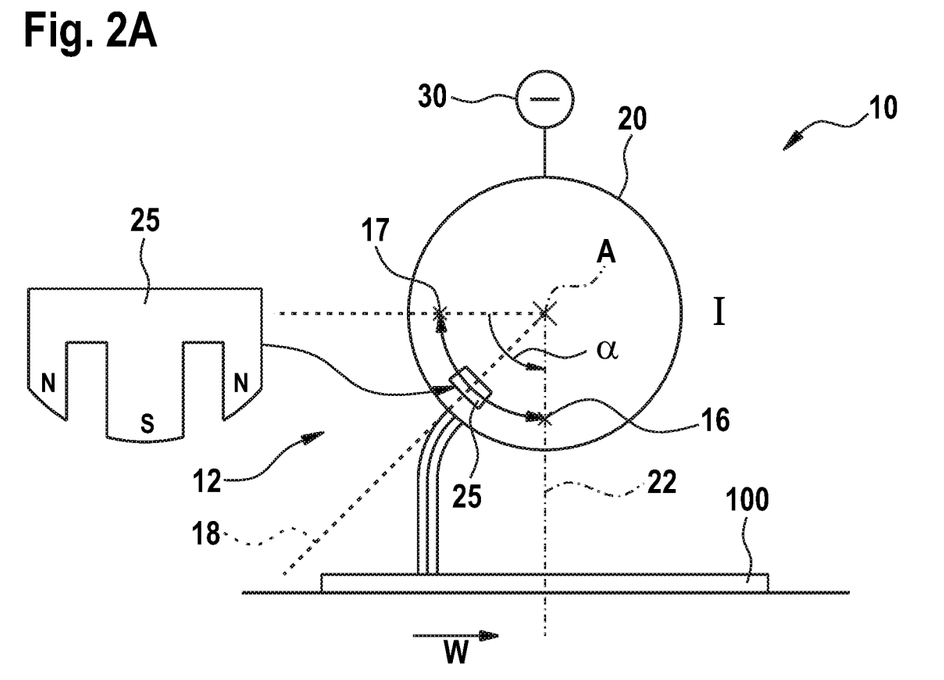
FIG. 2A and FIG. 2B show schematic sectional views of a coating apparatus for illustrating methods of coating a substrate in accordance with embodiments described herein.
Figure 2B:
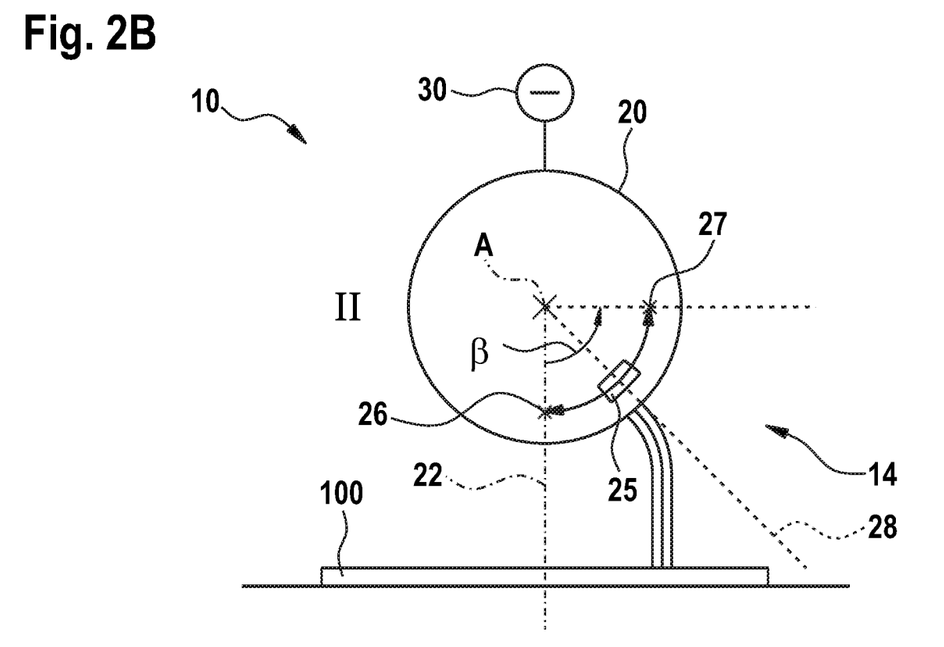

FIG. 2A and FIG. 2B show a coating apparatus for sputter deposition which is configured for being operated in accordance with the methods described herein. FIG. 2A shows the first coating phase I, wherein the substrate 100 is coated while moving the magnet assembly 25 in a reciprocating manner in a first angular sector 12. FIG. 2B shows the subsequent coating phase II, wherein the substrate 100 is coated while moving the magnet assembly 25 in a reciprocating manner in a second angular sector 14. The coating method shown in FIGS. 2A and 2B may include some or all of the features of the above described coating method which are not repeated here.

Before starting the coating operation, a first center angular position 18 of the first angular sector 12 and a second center angular position 28 of the second angular sector 14 may be set as appropriate. For example, the first center angular position 18 may be set such that, during the first coating phase I, the magnet assembly may pivot in a reciprocating manner with respect to the first center angular position 18 on a first side of the plane 22. Therein, the plane 22 extends perpendicularly from the substrate 100 through the rotation axis A of the magnet assembly 25. The second center angular position 28 may be set such that, during the subsequent coating phase II, the magnet assembly may pivot in a reciprocating manner with respect to the second center angular position 28 on a second side of the plane 22 opposing the first side.

In some embodiments, which may be combined with other embodiments described herein, a first angular extension α of the first angular sector 12 and a second angular extension β of the second angular sector 14 may be set as appropriate before starting the coating operation. In some embodiments, the first angular extension and the second angular extension are essentially identical. In some embodiments, the second angular sector 14 is a mirror image of the first angular sector 12 with respect to said plane 22. In some embodiments, the first angular sector 12 and the second angular sector 14 do not overlap. However, the inner turnaround position of the first angular sector 12 and the inner turnaround position of the second angular sector 14 may be located at the same location which is in said plane 22, i.e. at a position with minimum distance to the substrate.

In some embodiments, the sputter target 20 of the cathode assembly 10 is connected to a power supply 30 for setting the sputter target on an electric potential, e.g. on a negative electric potential during coating operation and/or on an essentially zero electric potential before and after coating operation.

In some embodiments, one or more anodes (not shown in FIG. 2A and FIG. 2B), which may be provided on a positive or ground potential, may be positioned close to the sputter target 20, i.e. outside of the sputter target. Such an anode may have the shape of a bar, with the bar's axis being typically arranged in parallel to a rotation axis of the sputter target. In some embodiments, a separate bias voltage may be applied to the substrate.

A permanent magnet as used in embodiments described herein may have two north magnetic poles and one south magnetic pole. The poles refer to a surface of the magnet assembly 25, respectively. The surfaces typically face the sputter target 20 from the inside thereof.

In many cases, a first pole is positioned in the middle whereas two opposite poles are arranged adjacent to the first pole. In FIG. 2A, an enlargement of the magnet assembly 25 is shown for illustrating such a situation. As shown, the south pole is positioned in the middle, whereas the north poles enframe the south pole. The pole surfaces' shape may be adapted to the curvature of the rotatable curved sputter target. In some embodiments, the surface of each pole defines a plane. The planes of the magnet poles are typically not parallel. However, the plane defined by the surface of the pole arranged in the middle has an orientation that is typically exactly in the middle of the orientations of the planes defined by the poles of the outer magnet poles. In more mathematical terms, the vectorial components of the outer pole surfaces sum up to the vectorial component of the inner pole surface. That is, the phrase "the magnet assembly is positioned at a non-zero angular position" describes a situation wherein a mean surface defined as the vectorial sum of all pole surfaces of the magnet assembly has an orientation that differs from the orientation of the substrate surface.

The substrate's surface defines a plane that is horizontally arranged in the shown figures. The plane 22 which extends perpendicularly from the substrate 100 to the rotation axis A defines the zero angular position of the magnet assembly and may also be referred to as the "substrate-target interconnection plane". In the sectional view of FIG. 2A, the substrate-target interconnection plane extends in a vertical direction through the center of the substrate 100.

Although the embodiments shown in the figures illustrate the sputter target 20 to be arranged above the horizontally arranged substrate and the definition of the substrate-target interconnection plane was illustratively explained with respect to those embodiments, it shall be mentioned that the orientation of the substrate in space can also be vertical. In particular, in view of large-area coating, transportation and handling of a substrate can be simplified by an essentially vertical orientation of the substrate. "Essentially vertical" as used herein may refer to an angle of less than 15° with respect to the vertical plane.

According to an aspect of the present disclosure, the magnet assembly is asymmetrically located with respect to the substrate-target interconnection plane during the first coating phase I, i.e. on the first side of the substrate-target interconnection plane, and the magnet assembly is asymmetrically located with respect to the substrate-target interconnection plane during the subsequent coating phase II, i.e. on the second side of the substrate-target interconnection plane.

It is to be noted that the first coating phase I may have a duration of 30 seconds or more and 5 minutes or less, and the subsequent coating phase II may have a duration of 30 seconds or more and 5 minutes or less. For example, one movement of the magnet assembly from the first turnaround angular position to the second turnaround angular position of one of the angular sectors and back to the first turnaround angular position may take 10 seconds or more and 30 seconds or less.

Accordingly, in some embodiments, the first coating phase I may be performed over 30 second or more, and the subsequent coating phase II may be performed over 30 seconds or more.

In some embodiments, the substrate 100 may be kept stationary at least during the first coating phase I and during the subsequent coating phase II. In some embodiments, the substrate 100 may also be kept stationary between the first coating phase I and the subsequent coating phase II. Layer uniformity can be improved.

According to some of the embodiments disclosed herein, a voltage may be provided to the sputter target 20 that is varied over time, e.g. between an essentially zero voltage and a non-zero voltage that is used for sputter operation.

For example, a zero voltage during relocation of the magnet assembly between the angular sectors is reduced to a value of less than 10%, more typically of less than 5% of a non-zero voltage value of the sputter target during sputter operation.

Layer uniformity can be further improved if the electrical field, i.e. the voltage, is reduced or switched off at times where the magnet assembly is not moved in a reciprocating manner. For example, the homogeneity of the deposited layer can be increased if sputtering is paused at those times where the magnet assembly is neither wobbled in the first angular sector nor wobbled in the second angular sector.

Before starting the coating operation, the magnet assembly may be positioned in the first angular sector 12, e.g. at the first center angular position 18 of the first angular sector 12. During positioning of the magnet assembly, an essentially zero electric potential may be applied to the sputter target 20. Coating operation may then start by applying an electric potential, e.g. a negative electric voltage, to the sputter target 20, as is illustrated in FIG. 2A. A plasma may be generated due to the electric field that is established between the negatively charged sputter target 20 and a positively charged or grounded anode surface.

During the first coating phase I, which is shown in FIG. 2A, the magnet assembly 25 may be moved in a reciprocating manner between the first turnaround angular position 16 and the second turnaround angular position 17 of the first angular sector 12, while the electric potential applied to the sputter target 20 may be kept negative, e.g. on a constant negative voltage. For example, the magnet assembly 25 may be moved back and forth two or more times between the first turnaround angular position 16 and the second turnaround angular position 17 while maintaining a constant negative target voltage. A first part of a layer may be deposited on the substrate 100.

After the first sputter phase I, the magnet assembly 25 may be positioned from the first angular sector 12 to the second angular sector 14, e.g. to the second center angular position 28 of the second angular sector 14. During positioning of the magnet assembly 25 in the second angular sector 14, an essentially zero electrical potential may be applied to the sputter target. Accordingly, the coating operation may be stopped after the first coating phase I and before the beginning of the second coating phase II.

During the second coating phase II, which is shown in FIG. 2B, the magnet assembly 25 may be moved in a reciprocating manner between the first turnaround angular position 26 and the second turnaround angular position 27 of the second angular sector 14, while the electric potential applied to the sputter target 20 may be kept negative, e.g. on a constant negative voltage. For example, the magnet assembly 25 may be moved back and forth two or more times between the first turnaround angular position 26 and the second turnaround angular position 27 of the second angular sector 14 while maintaining an essentially constant negative target voltage. A second part of the layer may be deposited on the substrate 100.

In other words, the target voltage may be non-zero during the coating and during the subsequent coating, and the target voltage may be essentially zero during positioning of the magnet assembly from the first angular sector 12 to the second angular sector 14 after the coating and before the subsequent coating in some embodiments.

In some embodiments, which may be combined with other embodiments disclosed herein, the coating method may be completed after the second coating phase II. For example, after the second coating phase II, the substrate 100 may be moved out of the coating area which is shown in the figures.

In other embodiments, coating may continue after the second coating phase II. For example, in some embodiments, a third coating phase may follow, in which the substrate is coated while moving the magnet assembly in a reciprocating manner in a third angular sector which is different from both the first and the second angular sectors, particularly wherein a third center angular position of the third angular sector is different from the first and second center angular positions. In some embodiments, after the second coating phase II, coating may continue by moving the magnet assembly back into the first angular sector 12, whereupon the substrate may be coated while moving the magnet assembly in a reciprocating manner in the first angular sector. Afterward, the method may stop or may continue accordingly.

According to a further aspect disclosed herein, a method of coating a substrate 100 with at least one cathode assembly 10 having a rotatable sputter target 20 and a magnet assembly 25 positioned inside the rotatable sputter target 20 is provided, the magnet assembly 25 being rotatable around a rotation axis A. The method is illustrated by the flow diagram shown in FIG. 6.

Figure 6:
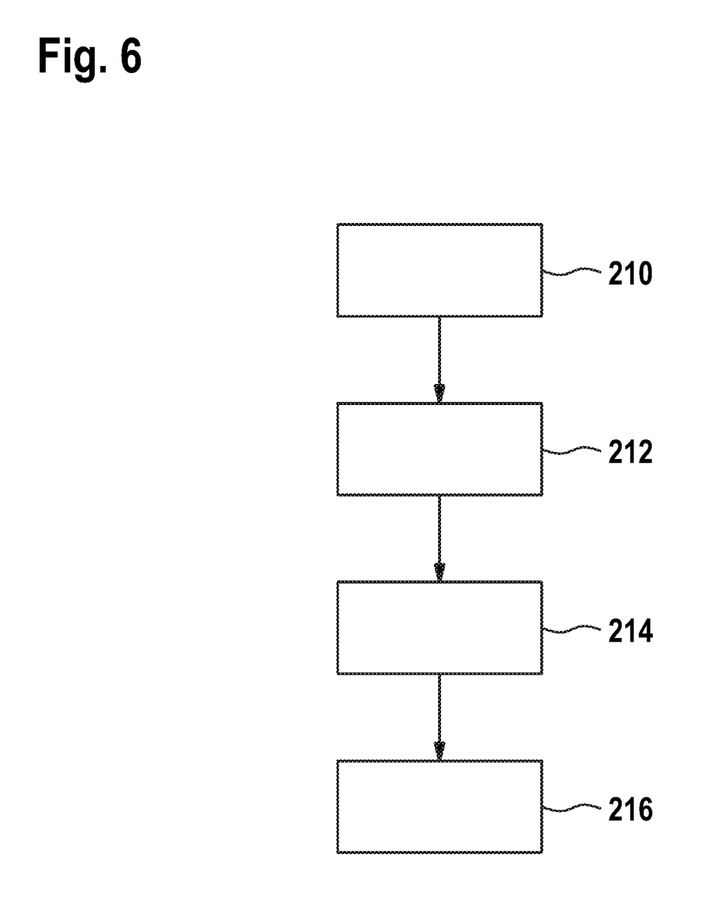
FIG. 6 is a flow diagram illustrating a method according to embodiments described herein.

In optional box 210 of FIG. 6, the magnet assembly 25 is positioned in a first angular sector 12, while keeping the target at essentially zero voltage. In box 212, the substrate 100 is coated while moving the magnet assembly in a reciprocating manner in the first angular sector 12, wherein a first center angular position 18 of the first angular sector 12 is located on a first side of a plane 22 perpendicularly extending from the substrate to the rotation axis A. In optional box 214, the magnet assembly 25 is positioned in a second angular sector 14, while keeping the target 20 at essentially zero voltage. In box 216, the substrate is subsequently coated while moving the magnet assembly in a reciprocating manner in the second angular sector 14, wherein a second center angular position 28 of the second angular sector is located on the second side of said plane 22.

The target voltage may be non-zero during the coating phases illustrated by boxes 212 and 214.

According to a further aspect, a coating apparatus configured for being operated according to the methods described herein is provided.

A coating apparatus for coating a substrate in accordance with embodiments described herein includes at least one cathode assembly 10 having a sputter target 20; a magnet assembly 25 which may be positioned inside the sputter target 20 and which is rotatable around a rotation axis A, and an actuatuor configured for moving the magnet assembly during coating in a reciprocating manner in two or more different angular sectors in succession, wherein the center angular positions and the extension angles of the angular sectors can be adjusted.

The coating apparatus may comprise a controller configured for providing a variable voltage to the sputter target 20, particularly for providing a non-zero voltage to the sputter target 20 while moving the magnet assembly in a reciprocating manner during the first coating phase I and during the second coating phase II, and/or for providing an essentially zero voltage to the sputter target 20 while positioning the magnet assembly in the first angular sector 12 and/or in the second angular sector 14.

According to an aspect of the present disclosure, the voltage applied to the sputter target can be varied over time. That is, a non-constant voltage can be applied to the sputter target. The sputter power changes not only depending on the magnet assembly position, but also depending on the voltage applied to the sputter target. The relation between the applied voltage and the sputter power may be linear in a first approximation.

In some embodiments, which may be combined with other embodiments disclosed herein, the sputter target 20 can be placed on a backing tube. The backing tube is mainly for mounting the sputter target which comprises the sputter material to be deposited. In order to reduce the high temperatures on the sputter target that result from the sputtering process, in many embodiments the sputter target is aligned with a cooling material tube. Water may be used as a cooling material. Cooling is beneficial because the major part of the energy put into the sputtering process—potentially in the order of magnitude of some kilo Watts—is transferred into heat of the sputter target. The magnet assembly may be positioned within the backing tube and the cooling material tube so that the magnet assembly can move therein to different angular positions, particularly along an essentially circular magnet assembly movement path. According to other embodiments, the complete inner part of the target tube is filled with cooling material such as water.

In some embodiments, the magnet assembly may be mounted on the axis of a cylindrical and rotatable sputter target. A pivoting movement of the magnet assembly as described herein may be caused by an electromotor providing the rotational force. In some embodiments, the cathode assembly is equipped with two shafts: A first shaft which the rotatable sputter target tube is mounted on and a second shaft. The first shaft may be rotated during operation of the cathode assembly. The movable magnet assembly is typically mounted to the second shaft. The second shaft may move independently from the first shaft in a manner so as to allow the rotational movement or pivoting movement of the magnet assembly as described herein. Accordingly, the actuator of the coating assembly may include the second shaft, the motor for driving the second shaft as well as a control system configured for moving the magnet assembly as described herein.

In some embodiments, the actuator may be connected to or include a processor and a user interface configured for entering the center angular positions and/or the extension angles of the at least two angular sectors for adjusting the coating method as appropriate.

Within the present disclosure, the figures illustrate cross sectional schematic views of coating apparatuses along with substrates exemplarily shown. Typically, the cathode assemblies 10 comprise the sputter targets 20 which may have the shape of a cylinder. In other words, the axis of the sputter target extends perpendicularly with respect to the paper planes of the figures. The same is true with respect to the magnet assemblies that are also only schematically shown as cross sectional elements. The rotations axis A of the magnet assembly extends perpendicular with respect to the paper planes of the figures. The magnet assemblies may extend along the complete length of the cylindrical sputter targets. For technical reasons, it is beneficial that the magnet assemblies extend over at least 80% of the cylinder length, more typically at least over 90% of the cylinder length.

According to an aspect described herein, a multitude of cathode assemblies 10, each having a rotatable sputter target 20, are provided for coating large area substrates. The area adapted for coating a substrate 100 shall be referred to as "coating area". The coating area may be adapted for coating one substrate 100 at one point in time. A multitude of substrates 100 can be coated one after the other in the coating area.

In many embodiments, the multitude of cathode assemblies 10 is arranged in an array of cathode assemblies. In particular, for static large-area substrate deposition, it is possible to provide a one-dimensional array of cathode assemblies that are linearly arranged or that are alternatively arranged along a curved line, e.g. in a bow-like setup. Typically, the number of cathode assemblies is between 2 and 20, more typically between 9 and 16 per coating area.

In some embodiments, the cathode assemblies 10 are spaced apart from each other equidistantly. It is further beneficial that the length of the sputter targets is slightly longer than the length of the substrate to be coated.

Additionally or alternatively, the cathode array may be slightly broader than the width of the substrate in a width direction W. "Slightly" typically includes a range of between 100% and 110%. The provision of a slightly larger coating length/width helps in avoiding boundary effects. In some cases, the cathode assemblies are located equidistantly away from the substrate.

Figure 3:
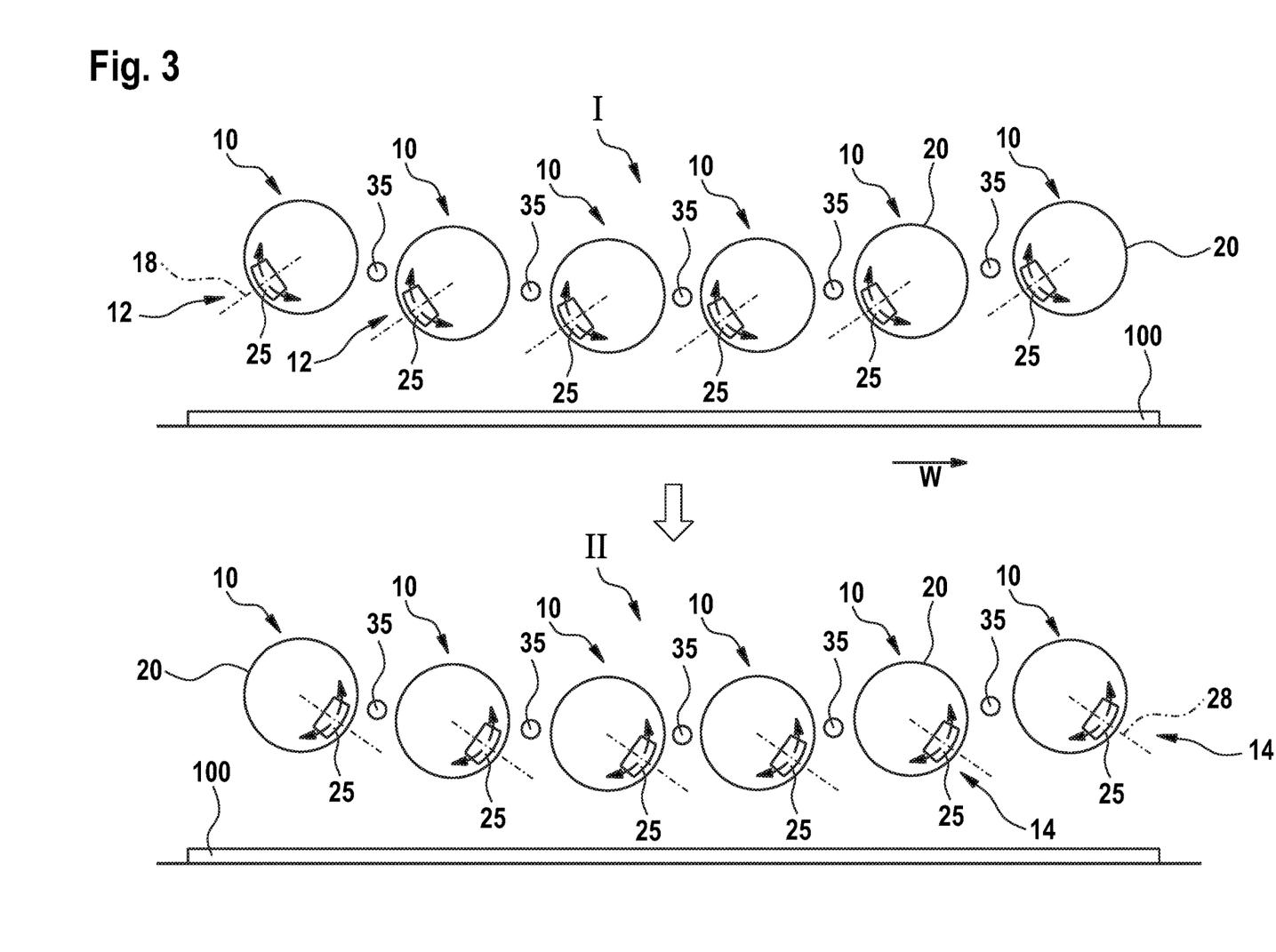
FIG. 3 shows a schematic view of a coating apparatus illustrating a method of coating a substrate in accordance with embodiments described herein.

In some embodiments, the multitude of cathode assemblies is arranged not in an equidistant fashion with respect to the substrate but along an arc's shape. The shape of the arc may be such that the inner cathode assemblies are located closer to the substrate than the outer cathode assemblies. Such a situation is schematically shown in FIG. 3. Alternatively, it is also possible that the shape of the arc defining the positions of the multitude of cathode assemblies is such that the outer cathode assemblies are located closer to the substrate than the inner cathode assemblies. The scattering behaviour depends on the material to be sputtered. Hence, depending on the application, i.e. on the material to be sputtered, providing the cathode assemblies on an arc shape will further increase the homogeneity. The orientation of the arc depends on the application.

In addition, FIG. 3 exemplarily shows anode bars 35 positioned between the cathode assemblies that may be used in some of the embodiments described herein.

According to some embodiments, the respective magnet assemblies in the sputter targets 20 may be moved synchronously. A synchronous movement may further increase the homogeneity of the layer.

The upper part of FIG. 3 shows the first coating phase I, and the lower part of FIG. 3 shows the subsequent coating phase II. During the first coating phase I, the magnet assemblies 25 are moved synchronously in a reciprocating manner in a first angular sector 12 in the respective sputter targets, and during the second coating phase, the magnet assemblies 25 are moved synchronously in a reciprocating manner in a second angular sector in the respective sputter targets, wherein the second angular sectors are different from the first angular sectors.

As to details of the movement trajectories of the magnet assemblies 25 in the respective sputter targets 20, reference is made to the above embodiments, wherein details are not repeated here. Further, as to the voltage that is applied to the respective sputter targets 20, reference is made to the explanations with regard to FIG. 2A and FIG. 2B.

In addition to the wobble movement of the magnet assemblies in the sputter targets around two or more center angular positions, it is alternatively or additionally possible to wobble the substrate. The term "wobbling" the substrate shall be understood as moving the substrate back and forth within a limited distance. Typically, the substrate is positioned at a first position for a predetermined time interval, and it is positioned at a second position for a predetermined time interval. In further embodiments, the substrate may additionally be positioned at a third position and a fourth position.

The present disclosure is particularly directed at large area substrate coatings. The term "large area substrates" may include substrates with a size of at least 1 m$^2$, e.g. 2 m$^2$ or more.

Figure 4A:
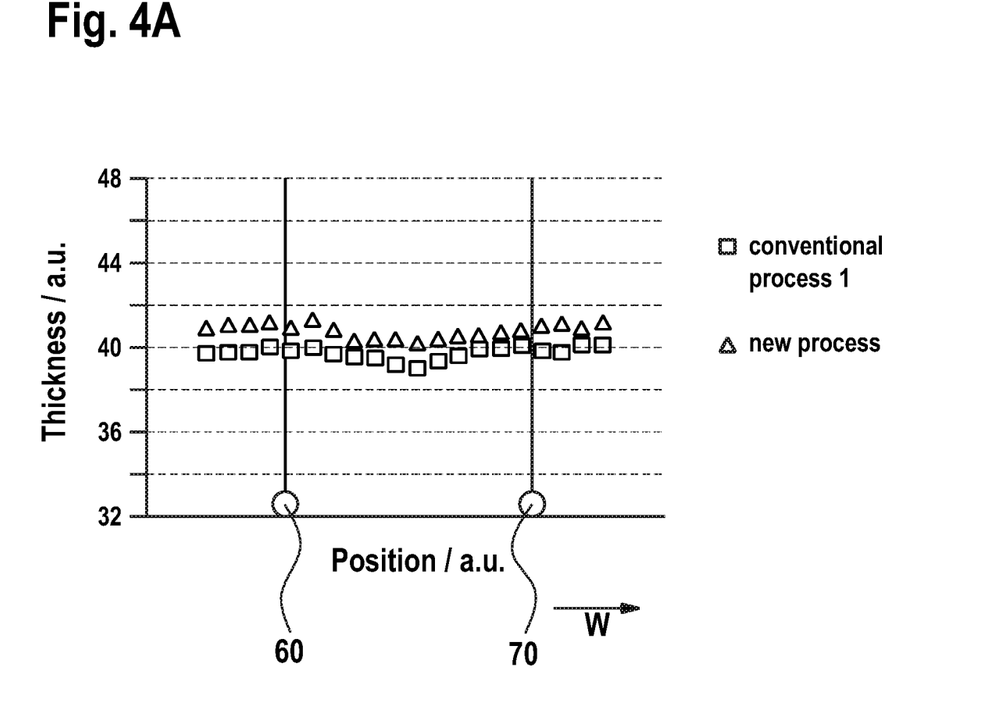
FIG. 4A and FIG. 4B show a comparison of the thickness uniformity of a film deposited by a conventional sputter process and by the sputter processes described herein.
Figure 4B:
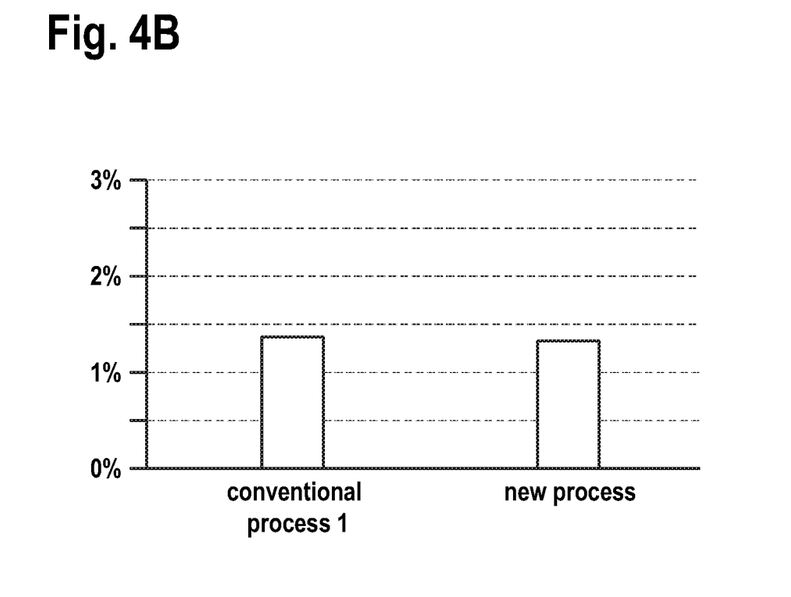

FIGS. 4A and 4B show a comparison of the thickness of a film deposited by a conventional process and by the processes described herein. The deposition takes place using two adjacent rotatable sputter targets 60 and 70 which are arranged at the locations of the vertical lines in FIG. 4A.

FIG. 4A schematically shows two film profiles measured after deposition with a conventional process and with the processes described herein. The y-axis represents an arbitrary unit for the film's thickness, whereas the x-axis represents a unit for the width direction W of the substrate which corresponds to the width direction W of the substrate 100 as indicated also in FIG. 2A. As can be seen from FIG. 4A, the thickness of the film deposited by the processes described herein in an area between the rotatable sputter targets 60 and 70 deviates slightly less from the thickness in an area under the rotatable targets than is the case for the conventional process. In other words, thickness uniformity in a substrate area centrally between two sputter targets can be improved.

The process described herein corresponds to the process shown in FIGS. 1A and 1B, whereas in the conventional process the substrate is coated while alternately maintaining two constant positions of the magnet assembly. In other words, in the conventional process, the magnet assembly is not moved during coating operation.

FIG. 4B shows a statistical analysis for the deviation of the thickness of a film deposited by the conventional process and by the processes described herein. As can be seen from FIG. 4B, the deviation of the thickness is slightly higher for the conventional process shown on the left side than for the process described herein shown on the right side. When practicing embodiments described herein, a uniformity of layer thickness can be increased.

Figure 5A:
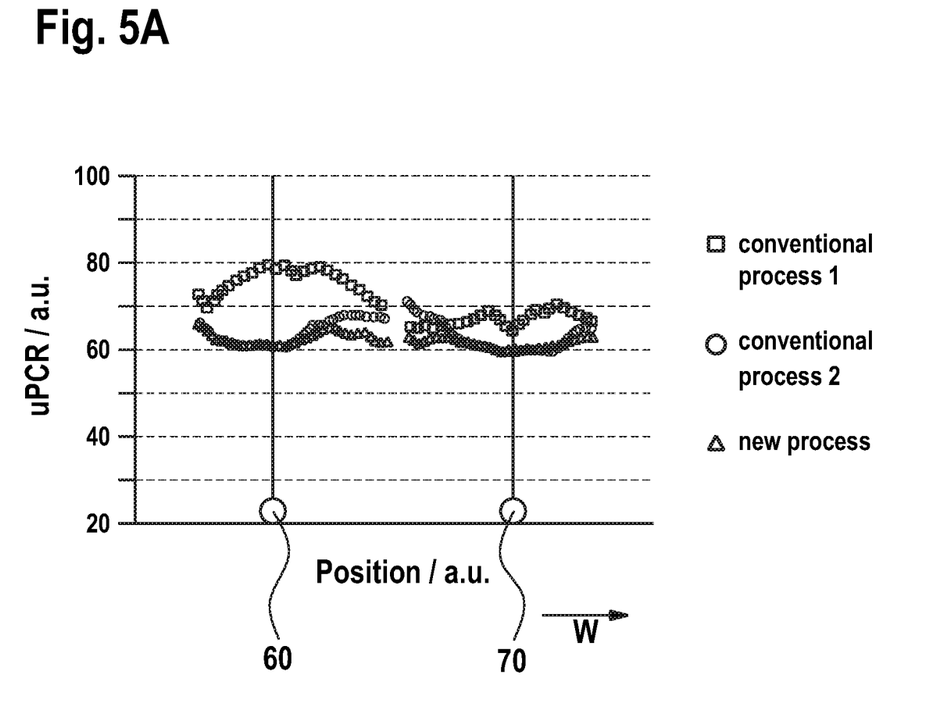
FIG. 5A and FIG. 5B show a comparison of an electric property of a film deposited by conventional sputter processes and by the sputter process described herein.
Figure 5B:
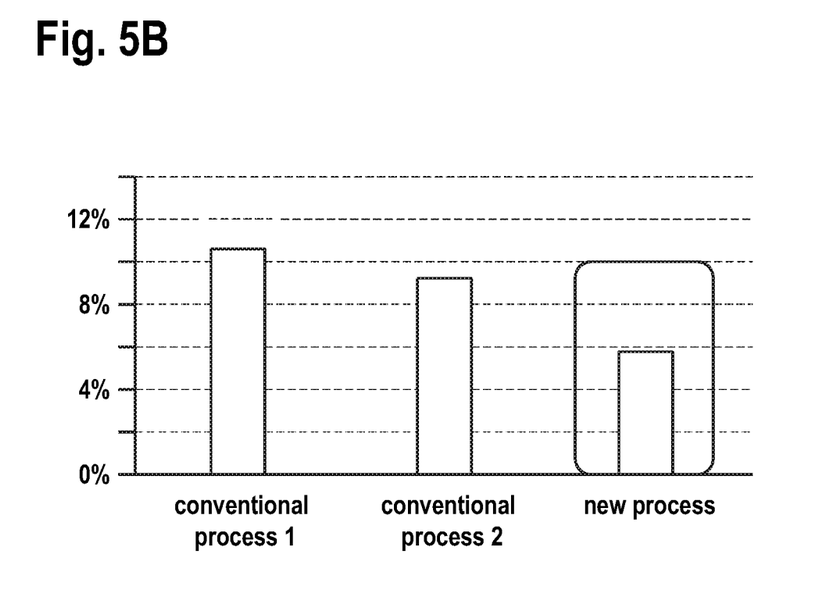

FIGS. 5A and 5B show a comparison of an electric property related to the conductivity of a film deposited by two conventional processes and using the processes described herein. The deposition takes place using two adjacent rotatable sputter targets 60 and 70 which are arranged at the locations of the vertical lines in FIG. 5A.

FIG. 5A schematically shows three film profiles measured after deposition with two different conventional processes and with the processes described herein. The y-axis represents an arbitrary unit for the film's electric property, whereas the x-axis represents a unit for the width direction W of the substrate which corresponds to the width direction W of the substrate 100 as also indicated in FIG. 2A. As can be seen from FIG. 5A, the illustrated electric property that corresponds to the conductivity of the film deposited by the processes described herein is more constant, specifically overall more constant than is the case for the conventional processes.

FIG. 5B shows a statistical analysis for the deviation of the electric property of a film deposited by the two conventional processes and by the processes described herein. As can be seen from FIG. 5B, the deviation of the illustrated electric property is higher for the conventional processes shown on the left side and in the middle than for the process described herein which is shown on the right side. When practicing embodiments, the uniformity of electric properties of the deposited layer can be increased.

The process described herein corresponds to the process shown in FIGS. 1A and 1B. In the conventional process 1 shown on the left side of FIG. 5B, the substrate is coated while alternately maintaining two constant positions of the magnet assembly. In other words, in the conventional process 1, the magnet assembly is not moved during the coating operation. In the conventional process 2 shown in the middle of FIG. 5B, the substrate is coated while moving the substrate in a single angular sector. In other words, in the conventional process 2, the magnet assembly is not moved in succession in two different angular sectors in a reciprocating manner.

The method and coating apparatus as disclosed herein can be used for depositing material on substrates. More particularly, the methods disclosed herein allow for a high uniformity of the deposited layer and can therefore be used in the production of displays such as flat panel displays, e.g., TFTs. The disclosed methods may also be used in the production of solar cells, in particular of thin-film solar cells. Given the improved uniformity, as a further effect thereof, the overall material consumption can be reduced which is particularly desirable when using expensive materials. For instance, the proposed methods could be used for the deposition of an indium tin oxide (ITO) layer in the production of a flat panel display or a thin film solar cell.

While the foregoing is directed to embodiments of the disclosure, other and further embodiments of the disclosure may be devised without departing from the basic scope thereof, and the scope thereof is determined by the claims that follow.

What is claimed is:

1. A coating apparatus for coating a substrate comprising:
at least one cathode assembly having a sputter target;
a magnet assembly positioned inside the sputter target and rotatable around a rotation axis; and
an actuator configured for moving the magnet assembly during coating in a reciprocating manner in two or more different angular sectors in succession, wherein at least one of center angular positions and extension angles of the angular sectors are adjustable,
the actuator being configured
for moving the magnet assembly during coating in a reciprocating manner two or more times between a first turnaround position of a first angular sector and a second turnaround position of the first angular sector, and
for moving the magnet assembly during subsequent coating in a reciprocating manner two or more times between a first turnaround position of a second angular sector and a second turnaround position of the second angular sector.

2. The coating apparatus of claim 1, further comprising a controller configured for providing a variable voltage to the sputter target.

3. The coating apparatus of claim 2, wherein the controller is configured for providing a non-zero voltage to the sputter target while moving the magnet assembly in the reciprocating manner.

4. The coating apparatus of claim 2, wherein the controller is configured for providing an essentially zero voltage to the sputter target while positioning the magnet assembly from the first angular sector to the second angular sector.

5. The coating apparatus of claim 1, wherein a plane perpendicularly extending from the substrate to the rotation axis defines a zero angular position of the magnet assembly with respect to the rotation axis, a first center angular position of the first angular sector being located on a first side of the plane and a second angular position of the second angular sector being located on a second side of the plane.

6. The apparatus of claim 5, wherein the first angular sector is located on the first side of said plane and the second angular sector is located on the second side of said plane.

7. The coating apparatus of claim 1, wherein a first center angular position of the first angular sector is different from a second center angular position of the second angular sector.

8. The coating apparatus of claim 1, wherein the first angular sector extends over a first angular extension ($\alpha$) of 15° or more and 60° or less, and the second angular sector extends over a second angular extension ($\beta$) of 15° or more and 60° or less.

9. The coating apparatus of claim 7, wherein the first angular sector extends over a first angular extension ($\alpha$) of 15° or more and 60° or less, and the second angular sector extends over a second angular extension ($\beta$) of 15° or more and 60° or less.

10. The coating apparatus of claim 1, further comprising a controller configured for providing a non-zero voltage during the coating and during the subsequent coating, and to provide an essentially zero voltage during positioning of the magnet assembly from the first angular sector to the second angular sector after the coating and before the subsequent coating.

11. The coating apparatus of claim 1, the actuator configured for performing the coating over 30 seconds or more, and to perform the subsequent coating over 30 seconds or more.

12. The coating apparatus of claim 1, wherein the sputter target is rotatable, and wherein the magnet assembly is arranged inside the sputter target.

13. The coating apparatus of claim 1 that is configured for keeping the substrate stationary during coating.

14. The coating apparatus of claim 1, wherein a plane perpendicularly extending from the substrate to the rotation axis defines a zero angular position of the magnet assembly with respect to the rotation axis.

* * * * *